United States Patent
Kondo et al.

(10) Patent No.: US 12,362,768 B2
(45) Date of Patent: Jul. 15, 2025

(54) MEMORY SYSTEM, MEMORY CONTROLLER, AND METHOD OF CONTROLLING NON-VOLATILE MEMORY

(71) Applicant: Kioxia Corporation, Tokyo (JP)

(72) Inventors: Yuki Kondo, Yokohama (JP); Kosuke Morinaga, Yokohama (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 18/439,320

(22) Filed: Feb. 12, 2024

(65) Prior Publication Data

US 2024/0275408 A1 Aug. 15, 2024

(30) Foreign Application Priority Data

Feb. 15, 2023 (JP) .................................. 2023-021414

(51) Int. Cl.
*H03M 13/00* (2006.01)
*H03M 13/15* (2006.01)

(52) U.S. Cl.
CPC ... *H03M 13/1545* (2013.01); *H03M 13/1575* (2013.01)

(58) Field of Classification Search
CPC ......... H03M 13/1515; H03M 13/1545; H03M 13/151; H03M 13/6325; H03M 13/1585; H03M 13/1105
See application file for complete search history.

(56) References Cited

U.S. PATENT DOCUMENTS 6,345,376 B1 * 2/2002 Cox .................. H03M 13/1545
714/781
7,058,876 B1 6/2006 Ireland et al.
(Continued)

FOREIGN PATENT DOCUMENTS

JP 4-34785 B2 6/1992
JP 7-231261 A 8/1995
(Continued)

OTHER PUBLICATIONS

Benjamin P. Smith et al., "Staircase Codes: FEC for 100 Gb/s OTN", Journal of Lightwave Technology, vol. 30, No. 1, Jan. 1, 2012. (8 pages).

*Primary Examiner* — Esaw T Abraham
(74) *Attorney, Agent, or Firm* — Oblon, McClelland, Maier & Neustadt, L.L.P.

(57) ABSTRACT

A memory system includes a non-volatile memory and a memory controller. The memory stores data encoded with an error correction code for correcting errors of n (n is 3 or more) bits or less. The controller estimates the number of error bits by using syndromes calculated from a received word. When the number of error bits is two or three, the controller executes variable transformation on a variable of an error locator polynomial corresponding to the number of error bits with a first value or a second value based on the syndromes. The controller also executes, with the first/ second values, calculation of roots of a transformed polynomial obtained by converting the error locator polynomial. The controller obtains roots of the error locator polynomial by variable inverse transformation on the roots of the transformed polynomial and corrects the error of the error locations corresponding to the obtained roots.

15 Claims, 5 Drawing Sheets

(56) References Cited

U.S. PATENT DOCUMENTS

| | | | |
|---|---|---|---|
| 7,502,989 B2 * | 3/2009 | Zhang | H03M 13/1525 |
| | | | 714/784 |
| 8,327,242 B1 * | 12/2012 | Anholt | H03M 13/45 |
| | | | 714/785 |
| 8,335,973 B2 | 12/2012 | Abe | |
| 9,362,953 B2 | 6/2016 | Kern et al. | |
| 9,608,668 B2 | 3/2017 | Ikegaya et al. | |
| 10,389,385 B2 * | 8/2019 | Shany | H03M 13/153 |
| 10,404,283 B2 * | 9/2019 | Yang | H03M 13/6502 |
| 10,826,533 B2 * | 11/2020 | Li | H03M 13/15 |
| 2019/0341937 A1 * | 11/2019 | Yang | H03M 13/159 |
| 2023/0387942 A1 | 11/2023 | Kondo et al. | |

FOREIGN PATENT DOCUMENTS

| | | |
|---|---|---|
| JP | 2001-84719 A | 3/2001 |
| JP | 4099160 B2 | 6/2008 |
| JP | 2023-173724 A | 12/2023 |
| WO | WO 01/84719 A1 | 11/2001 |

* cited by examiner

MEMORY SYSTEM, MEMORY CONTROLLER, AND METHOD OF CONTROLLING NON-VOLATILE MEMORY

CROSS-REFERENCE TO RELATED APPLICATIONS

This application is based upon and claims the benefit of priority from Japanese Patent Application No. 2023-021414, filed on Feb. 15, 2023, the entire contents of which are incorporated herein by reference.

FIELD

Embodiments described herein relate generally to a memory system, a memory controller, and a control method.

BACKGROUND

In a memory system, in order to protect data stored in a memory such as a NAND flash memory, error-correction-coded data is stored in the memory. Therefore, when the data stored in the memory is read, the error-correction-coded data (also referred to as a received word) read from the memory is decoded to restore the data before the error-correction coding.

DETAILED DESCRIPTION

A memory system according to an embodiment includes a non-volatile memory and a memory controller. The non-volatile memory is configured to store data encoded with an error correction code for correcting an error of n (n is an integer of 3 or more) bits or less. The memory controller is configured to read a received word from the non-volatile memory and calculate syndromes by using the received word. The memory controller is configured to estimate the number of error bits by using the syndromes. The memory controller is configured to perform processing when the number of error bits is estimated to be 2 or 3. The processing includes executing variable transformation on a variable of an error locator polynomial corresponding to the number of error bits by using a calculated value being either a first value or a second value. The first value and the second value are calculated on the basis of the syndromes. The processing also includes executing, by using the first value and the second value, calculation of roots of a transformed polynomial into which the error locator polynomial has been transformed according to the variable transformation. The memory controller is configured to obtain roots of the error locator polynomial by executing a variable inverse transformation using the calculated value at roots of the transformed polynomial. The memory controller is configured to correct an error of error locations corresponding to roots of the error locator polynomial.

Hereinafter, a preferred embodiment of a memory system according to the present invention will be described in detail with reference to the accompanying drawings.

First Embodiment

Figure 1:
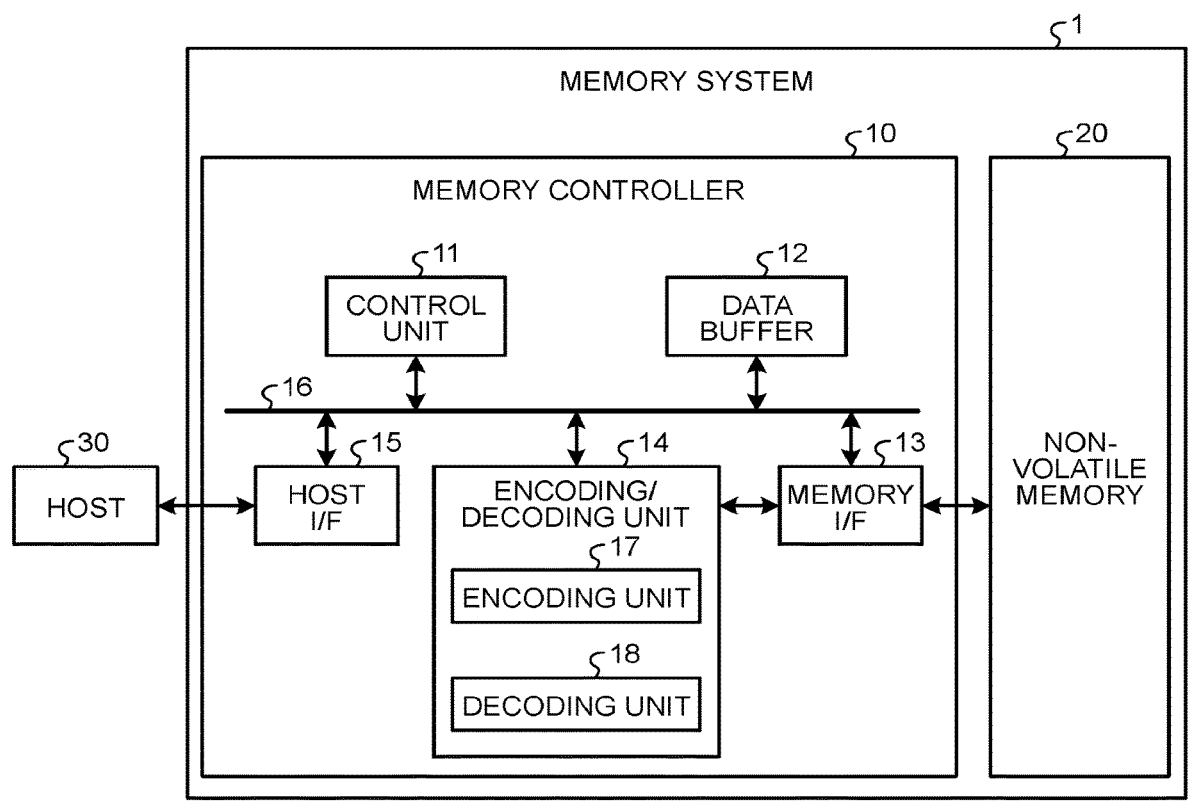
FIG. 1 is a block diagram of a memory system according to an embodiment.

A memory system according to the present embodiment will be described in detail with reference to the drawings. FIG. 1 is a block diagram illustrating a schematic configuration example of a memory system according to the present embodiment. As illustrated in FIG. 1, a memory system 1 includes a memory controller 10 and a non-volatile memory 20. The memory system 1 can be connected to a host 30, and FIG. 1 illustrates a state in which the memory system 1 is connected to the host 30. The host 30 may be, for example, an electronic device such as a personal computer or a mobile terminal.

The non-volatile memory 20 is a non-volatile memory that stores data in a non-volatile manner. In one example, the non-volatile memory 20 is a NAND flash memory (hereinafter, simply referred to as a NAND memory). In the following description, a case where a NAND memory is used as the non-volatile memory 20 will be exemplified, but a storage device other than the NAND memory, such as a three-dimensional structure flash memory, a resistive random access memory (ReRAM), or a ferroelectric random access memory (FeRAM), can be used as the non-volatile memory 20. Moreover, the non-volatile memory 20 is not necessarily a semiconductor memory, and the present embodiment can also be applied to various storage media other than the semiconductor memory.

The memory system 1 may be any of various memory systems including the non-volatile memory 20, such as a so-called solid state drive (SSD) or a memory card in which the memory controller 10 and the non-volatile memory 20 are configured as one package.

The memory controller 10 controls writing to the non-volatile memory 20 in accordance with a write request from the host 30. In addition, the memory controller 10 controls reading from the non-volatile memory 20 in accordance with a read request from the host 30. The memory controller 10 is, for example, a semiconductor integrated circuit configured as a system on a chip (SoC). The memory controller 10 includes a host interface (host I/F) 15, a memory interface (memory I/F) 13, a control unit 11, an encoding/decoding unit (codec) 14, and a data buffer 12. The host I/F 15, the memory I/F 13, the control unit 11, the encoding/decoding unit 14, and the data buffer 12 are mutually connected by an internal bus 16. Some of or all operations of each component of the memory controller 10 described below may be implemented by executing firmware by a central processing unit (CPU) or may be implemented by hardware.

The host I/F 15 performs processing according to an interface standard with the host 30, and outputs a command received from the host 30, user data to be written, and the like to the internal bus 16. In addition, the host I/F 15 transmits user data that is read from the non-volatile memory 20 and restored, a response from the control unit 11, and the like to the host 30.

The memory I/F 13 performs write processing to the non-volatile memory 20 on the basis of an instruction from the control unit 11. In addition, the memory I/F 13 performs read processing from the non-volatile memory 20 on the basis of an instruction from the control unit 11.

The control unit 11 integrally controls each component of the memory system 1. Upon receiving a command from the host 30 via the host I/F 15, the control unit 11 performs control according to the command. For example, the control unit 11 instructs the memory I/F 13 to write user data and parity to the non-volatile memory 20 in accordance with a command from the host 30. In addition, the control unit 11 instructs the memory I/F 13 to read the user data and the parity from the non-volatile memory 20 in accordance with a command from the host 30.

Upon receiving a write request from the host 30, the control unit 11 determines a storage area (memory area) on the non-volatile memory 20 for the user data accumulated in the data buffer 12. That is, the control unit 11 manages a write destination of the user data. The correspondence between a logical address of the user data received from the host 30 and a physical address indicating the storage area on the non-volatile memory 20 in which the user data is stored is stored as an address conversion table.

In addition, upon receiving a read request from the host 30, the control unit 11 converts a logical address designated by the read request into a physical address by using the above-described address conversion table, and instructs the memory I/F 13 to perform reading from the physical address.

In the NAND memory, in general, writing and reading are performed in data units called pages, and erasing is performed in data units called blocks. In the present embodiment, a plurality of memory cells connected to the same word line is referred to as a memory cell group. When the memory cell is a single level cell (SLC), one memory cell group corresponds to one page. When the memory cell is a multiple level cell (MLC), one memory cell group corresponds to a plurality of pages. In the present description, the MLC includes a triple level cell (TLC), a quad level cell (QLC), and the like. Each memory cell is connected to a word line and is also connected to a bit line. Therefore, each memory cell can be identified by an address for identifying a word line and an address for identifying a bit line.

The data buffer 12 temporarily stores the user data received from the host 30 by the memory controller 10 until the user data is stored in the non-volatile memory 20. In addition, the data buffer 12 temporarily stores the user data read from the non-volatile memory 20 until the user data is transmitted to the host 30. As the data buffer 12, for example, a general-purpose memory such as a static random access memory (SRAM) or a dynamic random access memory (DRAM) can be used. Note that the data buffer 12 may be mounted outside the memory controller 10 instead of being built in the memory controller 10.

The user data transmitted from the host 30 is transferred to the internal bus 16 and temporarily stored in the data buffer 12. The encoding/decoding unit 14 encodes the user data stored in the non-volatile memory 20 to generate a code word. Further, the encoding/decoding unit 14 decodes the received word read from the non-volatile memory 20 to restore the user data. Therefore, the encoding/decoding unit 14 includes an encoding unit (encoder) 17 and a decoding unit (decoder) 18. Note that the data encoded by the encoding/decoding unit 14 may include control data or the like used inside the memory controller 10 in addition to the user data.

Next, the write processing of the present embodiment will be described. The control unit 11 instructs the encoding unit 17 to encode the user data at the time of writing to the non-volatile memory 20. At that time, the control unit 11 determines a storage location (storage address) of the code word in the non-volatile memory 20, and also instructs the memory I/F 13 on the determined storage location.

The encoding unit 17 encodes the user data on the data buffer 12 on the basis of an instruction from the control unit 11 to generate a code word. As the encoding method, for example, an encoding method using an algebraic code such as a Bose-Chaudhuri-Hocquenghem (BCH) code or a Reed-Solomon (RS) code, and an encoding method (product code or the like) using these codes as component codes in the row direction and the column direction can be adopted. The memory I/F 13 performs control to store a code word in a storage location on the non-volatile memory 20 instructed from the control unit 11. Hereinafter, a case where a BCH code for correcting an error of 3 bits or less is used will be described as an example.

Next, processing at the time of reading from the non-volatile memory 20 of the present embodiment will be described. At the time of reading from the non-volatile memory 20, the control unit 11 designates an address on the non-volatile memory 20 and instructs the memory I/F 13 to perform reading. Moreover, the control unit 11 instructs the decoding unit 18 to start decoding. The memory I/F 13 reads a received word from a designated address of the non-volatile memory 20 according to an instruction of the control unit 11, and inputs the read received word to the decoding unit 18. The decoding unit 18 decodes the received word read from the non-volatile memory 20.

As described above, the decoding unit 18 decodes the received word read from the non-volatile memory 20. The decoding unit 18 implements the calculation of the roots of the error locator polynomial in the case that the number of error bits (hereinafter, the number of errors) is 2 or 3 with a simpler configuration.

Figure 2:
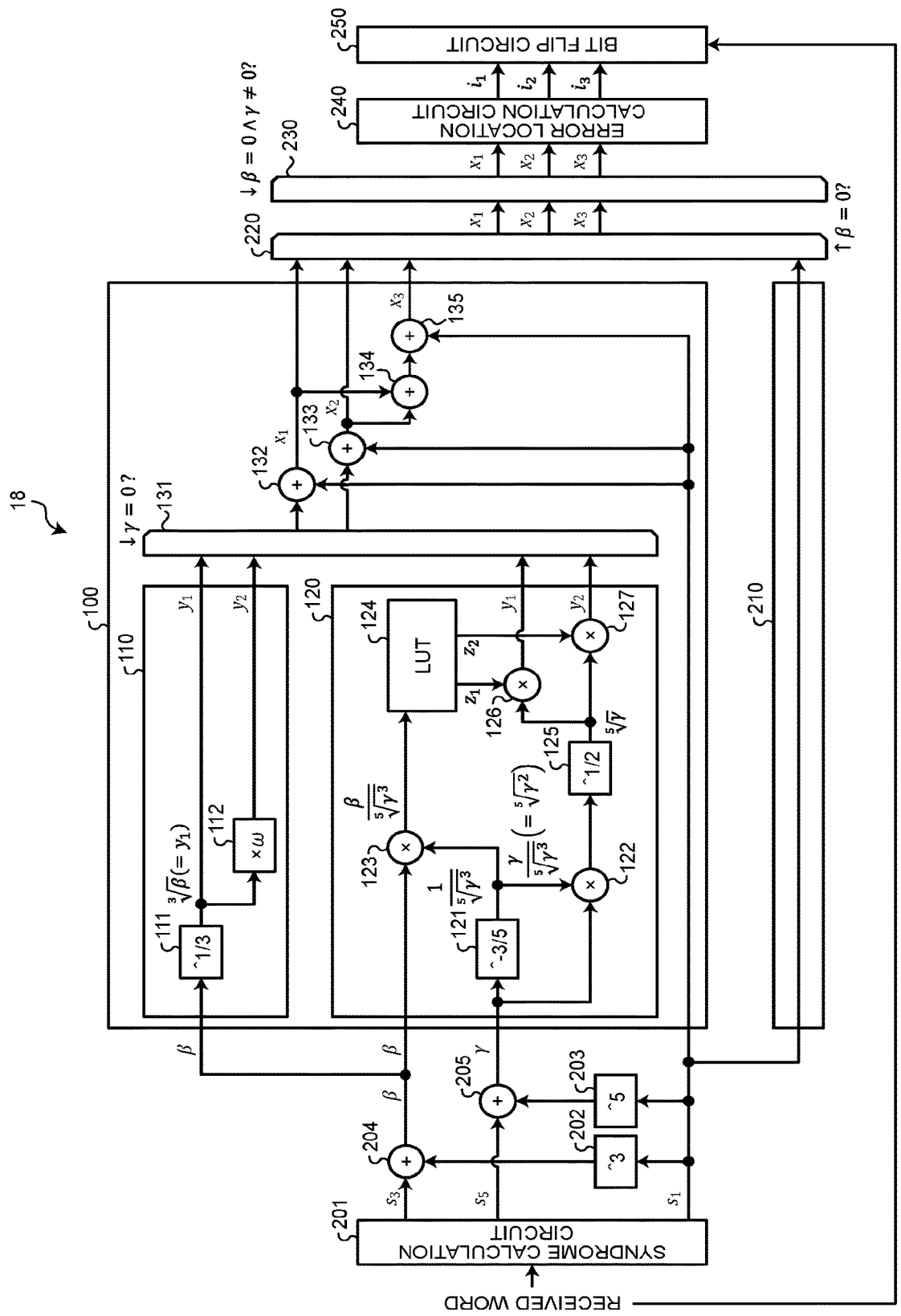
FIG. 2 is a block diagram of a decoding unit according to a first embodiment.

FIG. 2 is a block diagram illustrating a configuration example of the decoding unit 18 according to the present embodiment. FIG. 2 illustrates an example in a case where the decoding unit 18 is implemented by a hardware circuit. As illustrated in FIG. 2, the decoding unit 18 includes a syndrome calculation circuit 201, arithmetic circuits 202 to 205, a root calculation circuit 100, a root calculation circuit 210, selection circuits 220 and 230, an error location calculation circuit 240, and a bit flip circuit 250.

The syndrome calculation circuit 201 receives the received word r(x) and calculates and outputs syndromes. For example, let the received word be $r(x):=c(x)+e(x)$, the syndrome calculation circuit 201 calculates syndromes $s_i$ by $s_i:=r(\alpha^i)$. c(x) represents a code word, and e(x) represents an error. α represents a primitive element of $GF(2^m)$. When a BCH code for correcting an error of 3 bits or less is used, the syndrome calculation circuit 201 receives the received word r(x) and outputs syndromes $s_1$, $s_3$, and $s_5$. The syndromes $s_1$, $s_3$, and $s_5$ respectively correspond to the values obtained by substituting the first power, the third power, and the fifth power of α for a received word, where α is a primitive element of the Galois field.

The arithmetic circuits 202 to 205 perform the following operations.

Arithmetic circuit 202 outputs syndrome $s_1$ to the power of 3 (an example of power calculation).

Arithmetic circuit 203 outputs syndrome $s_1$ to the power of 5 (an example of power calculation).

Arithmetic circuit 204 adds an output value of arithmetic circuit 202 and syndrome $s_3$, and outputs β that is a result of the addition.

Arithmetic circuit 205 adds an output value of arithmetic circuit 203 and syndrome $s_5$, and outputs γ that is a result of the addition.

Note that β and γ are examples of calculated values (a first value and a second value) that are calculated on the basis of syndromes. As described below, in the first embodiment, the variable transformation is performed on the variable of the error locator polynomial by using γ as the calculation value out of β and γ, and the roots of the transformed polynomial obtained by transforming the error locator polynomial are calculated by using both β and γ. In the second embodiment, an example in which variable transformation is executed by using β that is the other of β and γ as a calculation value will be described.

The root calculation circuit 100 calculates the roots of the second-order or third-order error locator polynomial to be used when the number of errors is 2 or 3. In one example, the root calculation circuit 100 inputs β and γ, and outputs roots $x_1$, $x_2$, and $x_3$ of the error locator polynomial. Details of the root calculation circuit 100 will be described below.

The root calculation circuit 210 calculates a root of a zeroth-order or first-order error locator polynomial to be used when the number of errors is 0 or 1. In one example, the root calculation circuit 210 receives syndrome $s_1$ and outputs syndrome $s_1$ as the root of the error locator polynomial.

The number of errors can be estimated as follows by using the value of the syndromes. The number of errors and the value of the syndromes have the following relationship.

When the number of errors is 0 or 1, $s_1^3 = s_3$
When the number of errors is 0 or 1, $s_1^5 = s_5$
When the number of errors is 2 or 3, $s_1^3 \neq s_3$ The above-described relationship can be rephrased as follows.

When the number of errors is 0 or 1, $s_1^3 = s_3$ and $s_1^5 = s_5$
When the number of errors is 2 or 3, $s_1^3 \neq s_3$ Therefore, when ($s_1^3 \neq s_3$ or $s_1^5 \neq s_5$) and ($s_1^3 = s_3$) (namely, when $s_1^3 = s_3$ and $s_1^5 \neq s_5$), the number of errors is 4 or more. If assuming that the number of errors is 3 or less, the number of errors is 0 or 1 when $s_1^3 = s_3$.

Let $\beta := s_1^3 + s_3$ and $\gamma := s_1^5 + s_5$, then $\beta = 0$ is equivalent to $s_1^3 = s_3$, and $\gamma = 0$ is equivalent to $s_1^5 = s_5$. Therefore, the above-described relationships can be rephrased with β and γ as follows.

When (β≠0 or γ≠0) and (β=0) (that is, when β=0 and γ≠0), the number of errors is 4 or more.
Assuming that the number of errors is 3 or less, when β=0, the number of errors is 0 or 1.

The selection circuit 220 selects and outputs either the roots output from the root calculation circuit 100 or the root output from the root calculation circuit 210 in accordance with the number of errors. As described above, for example, assuming that the number of errors is 3 or less, β=0 means that the number of errors is 0 or 1. Therefore, when β=0, the selection circuit 220 selects and outputs the root output by the root calculation circuit 210.

The selection circuit 230 selects and outputs either the input roots or the information representing the correction failure in accordance with the number of errors. As described above, for example, β=0 and γ≠0 mean that the number of errors is 4 or more. Therefore, when β=0 and γ≠0, the selection circuit 230 outputs information indicating a correction failure.

The error location calculation circuit 240 inputs the roots of the error locator polynomial and outputs the error locations. In one example, when the roots $x_1$, $x_2$, and $x_3$ output from the root calculation circuit 100 are input, the error location calculation circuit 240 outputs the error locations $i_1$, $i_2$, and $i_3$. When syndrome $s_1$ that is the root output from the root calculation circuit 210 is input, the error location calculation circuit 240 outputs an error location $i_1$.

The bit flip circuit 250 receives the received word r(x) and the error locations output from the error location calculation circuit 240, and outputs a received word obtained by inverting the bit at the error locations.

Next, details of the root calculation circuit 100 will be described. First, an error locator polynomial will be described.

The l-th-order (l is an integer of 0 or more) error locator polynomial is expressed by the following Formula (1). For example, the error locator polynomial when l=0 to 3, that is, the zeroth-order to third-order error locator polynomials is expressed by the following Formulas (2) to (5).

$$\Pi_{k=1}^{l}(x - \alpha^{j_k}) (j_k; k=1,2,\ldots,l\text{-th error position},$$

$$\alpha: \text{primitive element of } GF(2^m)) \quad (1)$$

$$\Pi_{k=1}^{0}(x - \alpha^{j_k}) = 1 \quad (2)$$

$$\Pi_{k=1}^{1}(x - \alpha^{j_k}) = x + s_1 \quad (3)$$

$$\Pi_{k=1}^{2}(x - \alpha^{j_k}) = x^2 + s_1 x + \frac{s_1^3 + s_3}{s_1} \quad (4)$$

$$\Pi_{k=1}^{3}(x - \alpha^{j_k}) = x^3 + s_1 x^2 + \frac{s_1^2 s_3 + s_5}{s_1^3 + s_3} x + \frac{s_1^6 + s_1^3 s_3 + s_1 s_5 + s_3^2}{s_1^3 + s_3} \quad (5)$$

The zeroth-order and first-order error locator polynomials can collectively determine the root, as described below. Hereinafter, processing of collectively obtaining the root of the zeroth-order and first-order error locator polynomials is referred to as root calculation of a zeroth-order and first-order error locator polynomials. Similarly, the second-order and third-order error locator polynomials can collectively determine the roots. Hereinafter, the processing of collectively obtaining the roots of the second-order and third-order error locator polynomials is referred to as root calculation of a second-order and third-order error locator polynomials.

First, root calculation of the zeroth-order and first-order error locator polynomials will be described. When the number of errors is 0, $s_1 = 0$ holds, and when the number of errors is 1, $s_1 \neq 0$ holds. Therefore, the root calculation of the zeroth-order and first-order error locator polynomials can be executed by "excluding 0 from the root of σ(x) with σ(x)=x+$s_1$". This is derived from the following.

When the number of errors is 0, the root of σ(x) is $s_1$. $s_1$ is removed due to $s_1$=0, and there is no solution.
When the number of errors is 1, the root of σ(x) is $s_1$, and $s_1$ is not excluded due to $s_1$≠0.

Next, root calculation of the second-order and third-order error locator polynomials will be described. When the number of errors is 2, $s_1 \neq 0$, $s_1^3 \neq s_3$ and $s_1^6 + s_1 s_5 = s_1^3 s_3 + s_3^2$ hold. When the number of errors is 3, $s_1^3 \neq s_3$ and $s_1^6 + s_1 s_5 \neq s_1^3 s_3 + s_3^2$ hold. Therefore, assuming that σ(x) is expressed by the following Formula (6), the root calculation of the second-order and third-order error locator polynomials can be executed by "excluding 0 from the roots of σ(x)".

$$\sigma(x) = x^3 + s_1 x^2 + \frac{s_1^2 s_3 + s_5}{s_1^3 + s_3} x + \frac{s_1^6 + s_1^3 s_3 + s_1 s_5 + s_3^2}{s_1^3 + s_3} \quad (6)$$

This is derived from the following.
When the number of errors is 2, the roots of σ(x) are the roots of the second-order error locator polynomial and 0 according to the following Formula (7). Here, from $(s_1^3+s_3)/s_1 \ne 0$, the roots of the second-order error locator polynomial do not include 0. That is, the roots of the second-order error locator polynomial are not removed. Therefore, the roots of the second-order error locator polynomial are obtained by removing 0 from the roots of $\sigma(x)$.

$$\sigma(x) = x^3 + s_1 x^2 + \frac{s_1^3 + s_3}{s_1} x = \left(x^2 + s_1 x + \frac{s_1^3 + s_3}{s_1}\right) x \quad (7)$$

When the number of errors is 3, the roots of $\sigma(x)$ are the roots of the third-order error locator polynomial. Here, according to the following Formula (8), the roots of the third-order error locator polynomial do not include 0. That is, the roots of the third-order error locator polynomial are not removed. Therefore, the roots of the third-order error locator polynomial are obtained by removing 0 from the roots of $\sigma(x)$.

$$\frac{s_1^6 + s_1^3 s_3 + s_1 s_5 + s_3^2}{s_1^3 + s_3} \ne 0 \quad (8)$$

Next, a procedure of root calculation of $\sigma(x)$ expressed by Formula (6) will be described. Let the variable y be the variable obtained by the variable transformation from the variable x represented by $x=y+s_1$, $\sigma(x)$ is represented by the following Formula (9).

$$\sigma(x) = (y+s_1)^3 + s_1(y+s_1)^2 + \frac{s_1^2 s_3 + s_5}{s_1^3 + s_3}(y+s_1) + \frac{s_1^6 + s_1^3 s_3 + s_1 s_5 + s_3^2}{s_1^3 + s_3} \quad (9)$$

$$= y^3 + \frac{s_1^5 + s_5}{s_1^3 + s_3} y + s_1^3 + s_3$$

Note that Formula (9) corresponds to a polynomial obtained by transforming the error locator polynomial according to the variable transformation of $x=y+s_1$. Hereinafter, the polynomial obtained by transforming the error locator polynomial according to the variable transformation in this way may be referred to as a transformed polynomial.

Let $\beta:=s_1^3+s_3$ and $\gamma:=s_1^5+s_5$, then $\sigma(x)$ is expressed by the following Formula (10). Hereinafter, a case of (C1) $\gamma=0$ and a case of (C2) $\gamma \ne 0$ will be described separately.

$$\sigma(x) = y^3 + \frac{\gamma}{\beta} y + \beta \quad (10)$$

(C1) When $\gamma=0$

From the following Formula (11), the roots $y_1$, $y_2$, and $y_3$ are obtained by using correspondence information (LUT: lookup table, or the like) that returns the third roots of $\beta$ by using $\beta$ as key information. The LUT is an example of correspondence information in which possible values that can be taken by the key information and the roots of the transformed polynomial are associated with each other, and any other form of correspondence information may be used.

$$\sigma(x) = y^3 + \beta \quad (11)$$

(C2) When $\gamma \ne 0$

Let the variable z be the variable obtained by the variable transformation from the variable y expressed by the following Formula (12), then the roots $z_1$, $z_2$, and $z_3$ are obtained by using the LUT that returns the roots of the polynomial expressed by the following Formula (15) by using the value expressed by the following Formula (14) as the key information from the following Formula (13).

$$y = \sqrt[5]{\gamma} z \quad (12)$$

$$\sigma(x) = \left(\sqrt[5]{\gamma} z\right)^3 + \frac{\gamma}{\beta}\left(\sqrt[5]{\gamma} z\right) + \beta = \left(\sqrt[5]{\gamma}\right)^3 \left(z^3 + \frac{\left(\sqrt[5]{\gamma}\right)^3}{\beta} z + \frac{\beta}{\left(\sqrt[5]{\gamma}\right)^3}\right) \quad (13)$$

$$\frac{\beta}{\left(\sqrt[5]{\gamma}\right)^3} \quad (14)$$

$$z^3 + \frac{\left(\sqrt[5]{\gamma}\right)^3}{\beta} z + \frac{\beta}{\left(\sqrt[5]{\gamma}\right)^3} \quad (15)$$

By multiplying each of the obtained roots $z_1$, $z_2$, and $z_3$ by $\sqrt[5]{\gamma}$, the roots $y_1$, $y_2$, and $y_3$ of transformed polynomial are obtained. Note that "$\sqrt[n]{(\ )}$" represents the n-th root of the value in parentheses. For example, $\sqrt[5]{\gamma}$ represents the fifth root of $\gamma$. When n=2, it may be simply described as "$\sqrt{(\ )}$". Moreover, by adding $s_1$ to each of the obtained roots $y_1$, $y_2$, and $y_3$, the roots $x_1$, $x_2$, and $x_3$ of $\sigma(x)$ are obtained.

Note that the third roots $y_2$ and $y_3$ of $\beta$ may be obtained by $y_2=y_1\omega$ and $y_3=y_1\omega^2$ by using the third root $y_1$ of $\beta$. However, $\omega$ is the third root of 1 without 1.

In addition, the root $x_3$ of $\sigma(x)$ may be obtained by $x_3=x_1+x_2+s_1$ by using the roots $x_1$ and $x_2$ of $\sigma(x)$. In this case, only the roots $y_1$ and $y_2$ and only the roots $z_1$ and $z_2$ may be obtained.

As shown in Formula (12), in the first embodiment, variable transformation is executed by using $\gamma$ alone as a calculation value out of $\beta$ and $\gamma$. The variable transformation can be interpreted as being used for reducing the number of pieces of key information of the LUT. For example, by using the variable transformation of Formula (12), the roots $z_1$, $z_2$, and $z_3$ can be obtained from the LUT by using one piece of key information expressed by Formula (14).

As the variable transformation for by using one piece of key information, variable transformation other than Formula (12) is also conceivable. Hereinafter, a comparative example by using variable transformation other than Formula (12) will be described.

In the comparative example, let the variable z be the value obtained by the variable transformation from the variable y expressed by the following Formula (16), then the roots $z_1$, $z_2$, and $z_3$ are obtained by using the LUT that returns the roots of the polynomial expressed by the following Formula (18) with $\sqrt{(\beta^5/\gamma^3)}$ as one piece of key information according to the following Formula (17).

$$y = \sqrt{\frac{\gamma}{\beta}} z \quad (16)$$

$$\sigma(x) = \left(\sqrt{\frac{\gamma}{\beta}} z\right)^3 + \frac{\gamma}{\beta}\left(\sqrt{\frac{\gamma}{\beta}} z\right) + \beta = \left(\sqrt{\frac{\gamma}{\beta}}\right)^3 \left(z^3 + z + \sqrt{\frac{\beta^5}{\gamma^3}}\right) \quad (17)$$

$$z^3 + z + \sqrt{\frac{\beta^5}{\gamma^3}} \quad (18)$$

By multiplying each of the obtained roots $z_1$, $z_2$, and $z_3$ by $\sqrt{(\gamma/\beta)}$, the roots $y_1$, $y_2$, and $y_3$ of transformed polynomial are obtained. Moreover, by adding $s_1$ to each of the obtained roots $y_1$, $y_2$, and $y_3$, the roots $x_1$, $x_2$, and $x_3$ of $\sigma(x)$ are obtained.

In the comparative example, calculation of the following two inverse elements is required.
"$1/\gamma$" used for calculating the key information $\sqrt{(\beta^5/\gamma^3)}$
"$1/\beta$" used for calculating $\sqrt{(\gamma/\beta)}$ to be multiplied by the roots $z_1$, $z_2$, and $z_3$ when obtaining the roots $y_1$, $y_2$, and $y_3$ On the other hand, in the present embodiment, calculation of $\gamma$ to the power of $(-3/5)$ is necessary for calculation of the key information expressed by Formula (14) (details will be described below).

In other words, in the present embodiment, only the calculation of $(-3/5)$ power is required instead of the calculation of the two inverse elements. Although the calculation of the $(-3/5)$ power may require a circuit scale similar to that of the inverse element, at least in the present embodiment, the calculation corresponding to the inverse element calculation can be reduced from twice to once.

The root calculation circuit 100 is configured to execute the root calculation of the second-order and third-order error locator polynomials as described above. Details of the root calculation circuit 100 of FIG. 2 will be described. The root calculation circuit 100 includes root calculation circuits 110 and 120, a selection circuit 131, and arithmetic circuits 132 to 135.

The root calculation circuit 110 calculates the roots when (C1) $\gamma$=0. The root calculation circuit 110 includes an LUT 111 and an arithmetic circuit 112. The LUT 111 and the arithmetic circuit 112 perform the following operations.

LUT 111 outputs the root $\gamma_1$ that is the third root of $\beta$.
Arithmetic circuit 112 multiplies the root $y_1$ by $\omega$ (the cubic root of 1 without 1), and outputs the root $y_2$ that is a result of the multiplication.

The root calculation circuit 120 performs the root calculation when (C2) $\gamma \neq 0$.

The root calculation circuit 120 includes arithmetic circuits 121 to 123, an LUT 124, and arithmetic circuits 125 to 127. The arithmetic circuits 121 to 123, the LUT 124, and the arithmetic circuits 125 to 127 execute the following operations.

Arithmetic circuit 121 calculates $\gamma$ to the power of $(-3/5)$.
Arithmetic circuit 122 multiplies $\gamma$ to the power of $(-3/5)$ by $\gamma$, and outputs a multiplication result $\gamma/(\sqrt[5]{(\gamma^3)})=\sqrt[5]{(\gamma^2)}$.
Arithmetic circuit 123 multiplies $\gamma$ to the power of $(-3/5)$ by $\beta$ and outputs $\beta/(\sqrt[5]{(\gamma^3)})$ as a result of multiplication.
LUT 124 outputs roots $z_1$ and $z_2$ by using $\beta/(\sqrt[5]{(\gamma^3)})$ as key information.
Arithmetic circuit 125 calculates $\sqrt[5]{(\gamma)}$ that is a 1/2 power of $\sqrt[5]{(\gamma^2)}$.
Arithmetic circuit 126 multiplies root $z_1$ and $\sqrt[5]{(\gamma)}$, and outputs root $\gamma_1$ that is a result of the multiplication.
Arithmetic circuit 127 multiplies root $z_2$ and $\sqrt[5]{(\gamma)}$, and outputs root $y_2$ that is a result of the multiplication.

The selection circuit 131 selects and outputs either: the roots $y_1$ and $y_2$ calculated by the root calculation circuit 110, or the roots $y_1$ and $y_2$ calculated by the root calculation circuit 120 in accordance with whether $\gamma$ is 0. In one example, the selection circuit 131 selects the roots $y_1$ and $y_2$ calculated by the root calculation circuit 110 when $\gamma$=0, and selects the roots $y_1$ and $y_2$ calculated by the root calculation circuit 120 when $\gamma \neq 0$.

The arithmetic circuits 132 to 135 perform the following operations.

Arithmetic circuit 132 adds syndrome $s_1$ to root $y_1$, and outputs root $x_1$ that is a result of the addition.
Arithmetic circuit 133 adds syndrome $s_1$ to root $y_2$, and outputs root $x_2$ that is a result of the addition.
Arithmetic circuit 134 adds root $x_2$ to root $x_1$, and outputs $x_1+x_2$ that is a result of the addition.
Arithmetic circuit 135 adds syndrome $s_1$ to $x_1+x_2$, and outputs root $x_3$ that is a result of the addition.

Note that the arithmetic operation by the arithmetic circuits 132 to 135 can be interpreted as an arithmetic operation of executing inverse transform of variable transformation (variable inverse transformation) on the roots $y_1$ and $y_2$ of the transformed polynomial to obtain the roots $x_1$, $x_2$, and $x_3$ of the error locator polynomial.

Figure 3:
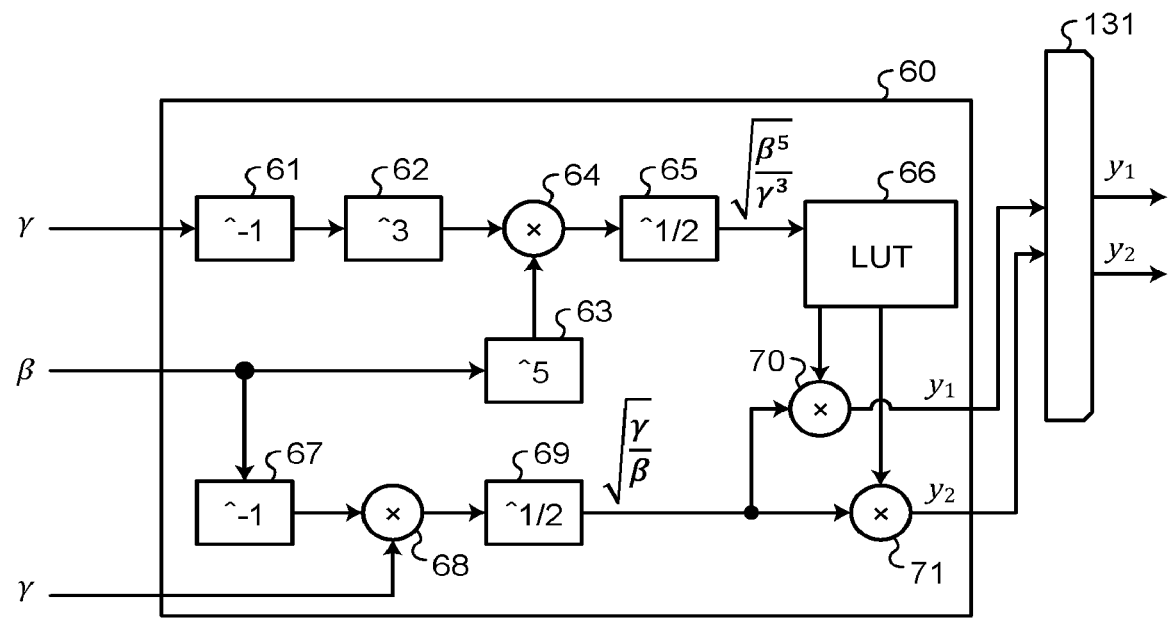
FIG. 3 is a diagram illustrating a configuration example of a circuit of a comparative example.

A configuration example of a circuit of a comparative example will be described. FIG. 3 is a diagram illustrating a configuration example of a circuit of a comparative example. In the comparative example, the configuration of the root calculation circuit 120 is different from that of the present embodiment. Therefore, in FIG. 3, a root calculation circuit 60 of the comparative example corresponding to the root calculation circuit 120 is mainly described. Hereinafter, the root calculation circuit 60 will be described.

The root calculation circuit 60 includes arithmetic circuits 61 to 65, an LUT 66, and arithmetic circuits 67 to 71. The arithmetic circuits 61 to 65, the LUT 66, and the arithmetic circuits 67 to 71 execute the following operations.

Arithmetic circuit 61 calculates inverse element $1/\gamma$ of $\gamma$ (inverse element calculation circuit).
Arithmetic circuit 62 calculates $1/\gamma^3$ that is inverse element $1/\gamma$ to the power of 3.
Arithmetic circuit 63 calculates $\beta^5$ that is $\beta$ to the fifth power.
Arithmetic circuit 64 multiplies $1/\gamma^3$ and $\beta^5$, and outputs $\beta^5/\gamma^3$ that is a result of the multiplication.
Arithmetic circuit 65 calculates $\sqrt{(\beta^5/\gamma^3)}$ that is square root of $\beta^5/\gamma^3$.
LUT 66 output roots $z_1$ and $z_2$ by using $\sqrt{(\beta^5/\gamma^3)}$ as key information.
Arithmetic circuit 67 calculates an inverse element $1/\beta$ of $\beta$ (inverse element calculation circuit).
Arithmetic circuit 68 multiplies the inverse element $1/\beta$ and $\gamma$, and outputs $\gamma/\beta$ that is a result of the multiplication.
Arithmetic circuit 69 calculates $\sqrt{(\gamma/\beta)}$ that is square root of $\gamma/\beta$.
Arithmetic circuit 70 multiplies root $z_1$ by $\sqrt{(\gamma/\beta)}$, and outputs root $\gamma_1$ that is a result of the multiplication.
Arithmetic circuit 71 multiplies root $z_2$ by $\sqrt{(\gamma/\beta)}$, and outputs root $y_2$ that is a result of the multiplication.

Thus, in the comparative example, two arithmetic circuits 61 and 67 are required as inverse element calculation circuits. On the other hand, in the present embodiment, one arithmetic circuit 121 that calculates the $(-3/5)$ power may be provided as a calculation circuit having a scale similar to that of the inverse element calculation circuit. The inverse element calculation circuit may have a larger circuit scale than other arithmetic circuits. Even in such a case, according to the present embodiment, since the number of circuits having a large circuit scale can be reduced, the circuit scale of the decoding unit 18 can be more efficiently reduced.

In a case where the decoding unit 18 is implemented by the CPU and the firmware, the firmware may be configured to execute a single calculation of $(-3/5)$ power as calculation on the same level as the inverse element calculation for root calculation of the second-order and third-order error locator polynomials. Therefore, firmware for performing error correction (decoding) can have a simpler configuration.

Moreover, in the present embodiment, only γ out of β and γ is used for variable transformation, so that the calculation necessary for B that is the other of β and γ is only one multiplication by the arithmetic circuit 123. Therefore, for example, a configuration can be made simpler than that of the comparative example in which β needs to be raised to the power of 5 (arithmetic circuit 63) and multiplied (arithmetic circuit 64).

The present embodiment can be applied to GF($2^m$) in which the existence of the fifth root is guaranteed (m is a value indivisible by 4), that is, applied to a case where m is indivisible by 4.

Figure 4:
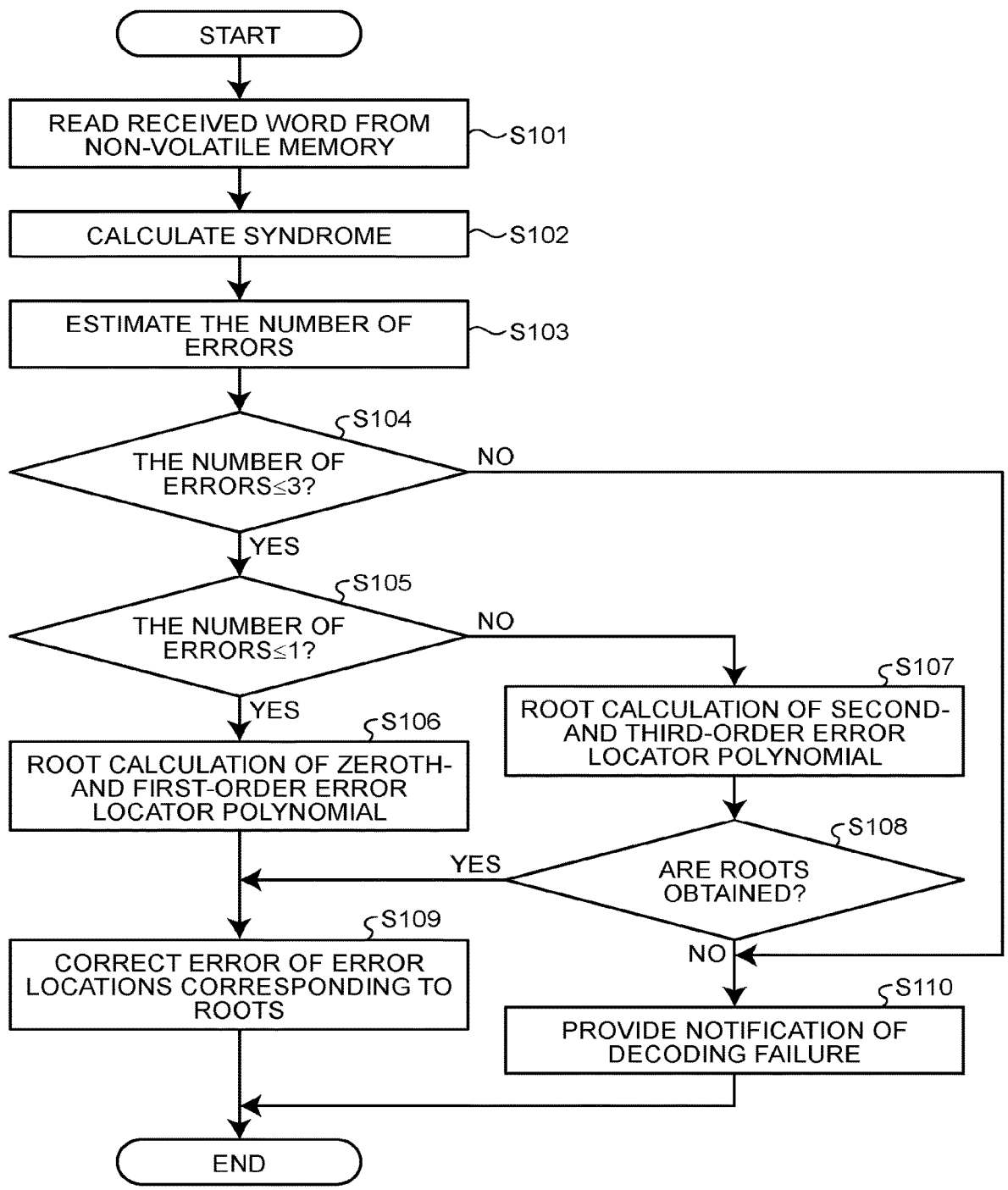
FIG. 4 is a flowchart of decoding processing according to the embodiment.

Next, the procedure of decoding processing by the memory system 1 will be described. FIG. 4 is a flowchart illustrating an example of decoding processing according to the present exemplary embodiment.

The control unit 11 reads the error correction code from non-volatile memory 20, and obtains the received word (Step S101). The control unit 11 then instructs the decoding unit 18 to start decoding.

The syndrome calculation circuit 201 of the decoding unit 18 calculates syndromes from the received word (Step S102).

Next, the decoding unit 18 estimates the number of errors (Step S103). The decoding unit 18 determines whether the number of errors is 3 or less (Step S104). In a case where the number of errors is larger than 3 (Step S104: No), the decoding unit 18 provides a notification of a decoding failure (Step S110), and ends the decoding processing.

When the number of errors is 3 or less (Step S104: Yes), the decoding unit 18 further determines whether the number of errors is 1 or less (Step S105). In a case where the number of errors is 1 or less (Step S105: Yes), the decoding unit 18 executes root calculation of the zeroth-order and first-order error locator polynomials (Step S106). When the number of errors is not 1 or less (Step S105: No), the decoding unit 18 executes root calculation of the second-order and third-order error locator polynomials (Step S107).

When the root calculation of the second-order and third-order error locator polynomials is executed, the decoding unit 18 determines whether the roots are obtained by the root calculation of the second-order and third-order error locator polynomials (Step S108).

For the second-order and third-order error locator polynomials, there may be no roots for the value of $\beta/(\sqrt[5]{\gamma^3})$. In such a case, for example, the LUT is configured to associate information indicating that the roots do not exist with the key information of the LUT corresponding to this value. When the information indicating that the roots do not exist is obtained from the LUT, the decoding unit 18 determines that the roots cannot be obtained. It should be noted that syndrome $s_1$ is always obtained as a root for the zeroth-order and first-order error locator polynomials.

In a case where the roots cannot be obtained (Step S108: No), the decoding unit 18 provides a notification of a decoding failure (Step S110), and ends the decoding processing.

When the roots are obtained (Step S108: Yes), and after the root calculation of the zeroth-order and first-order error locator polynomials, the decoding unit 18 corrects the error of the error locations corresponding to the roots (Step S109), and ends the decoding processing.

The decoding unit 18 may determine whether or not the values of all the syndromes are 0 after calculating the syndromes in Step S102, for example, and end the decoding processing when all the syndromes are 0. This is because when all syndromes are 0, it can be determined that there is no error in the received word.

While the case of using the BCH code that corrects errors of 3 bits or less has been described as an example, the similar procedure can also be applied to a configuration using the BCH code that corrects errors of n (n is an integer of 3 or more) bits or less. For example, in a case where a BCH code for correcting an error of 5 bits or less is used, the above procedure can be applied to decoding in a case where the number of errors is 0 to 3. Any procedure may be used for decoding when the number of errors is 4 or 5.

Second Embodiment

In the second embodiment, variable transformation using β alone as a calculation value out of β and γ is executed. The overall configuration of the memory system of the second embodiment is similar to that of FIG. 1, but the configuration of the decoding unit is different from that of the first embodiment. Hereinafter, details of the function of a decoding unit 18-2 of the second embodiment will be described.

Figure 5:
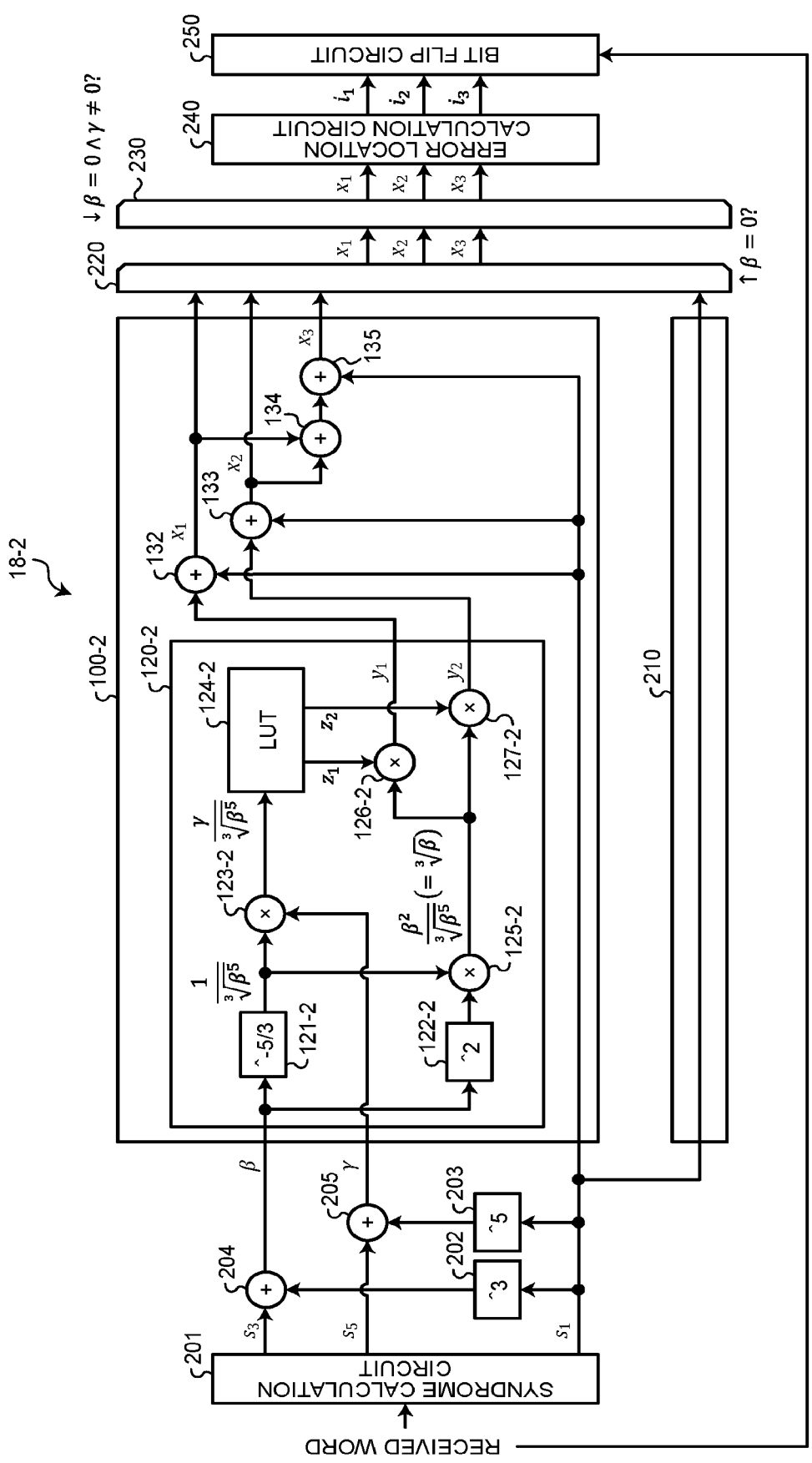
FIG. 5 is a block diagram of a decoding unit according to a second embodiment.

FIG. 5 is a block diagram illustrating a configuration example of the decoding unit 18-2 according to the second embodiment. FIG. 5 illustrates an example in a case where the decoding unit 18-2 is implemented by a hardware circuit. As illustrated in FIG. 5, the decoding unit 18-2 includes a syndrome calculation circuit 201, arithmetic circuits 202 to 205, a root calculation circuit 100-2, a root calculation circuit 210, selection circuits 220 and 230, an error location calculation circuit 240, and a bit flip circuit 250.

The second embodiment is different from the first embodiment in that, the root calculation circuit 100-2 does not include the root calculation circuit 110 and the selection circuit 131, and the function of a root calculation circuit 120-2 is different from the first embodiment. Other configurations are similar to those of the root calculation circuit 100 of the first embodiment, so that the same reference numerals are given, and description thereof is omitted.

In the second embodiment, it is not necessary to classify conditions such as classification into the conditions (C1) and (C2) in the above-described first embodiment. As a result, a circuit corresponding to the root calculation circuit 110 and a circuit corresponding to the selection circuit 131 for dividing the output of the circuit are unnecessary.

Hereinafter, the reason that the case division is unnecessary will be described. The condition (C1) of the first embodiment can be interpreted as a condition for separating the calculation (root calculation circuit 110) in the case of γ=0 from the calculation (root calculation circuit 120) in the case of γ≠0 so as not to cause division calculation by 0.

β used for variable transformation in the second embodiment. Since B≠0 holds, when the number of errors is 2 or 3, the root calculation circuit 100-2 that calculates the root of the second-order or third-order error locator polynomial used when the number of errors is 2 or 3 can be configured on the assumption that β≠0 is satisfied, in other words, division by 0(=β) does not occur. Thus, in the second embodiment, the classification into (C1) and (C2) in the first embodiment is unnecessary.

The root calculation of the second-order and third-order error locator polynomials σ(x) in the second embodiment will be described below. σ(x) is expressed by above-described Formula (10) as in the first embodiment. In the second embodiment, let the variable z be the value obtained by the variable transformation from the variable y expressed by the following Formula (19), then the roots $z_1$, $z_2$, and $z_3$ are obtained from the following Formula (20) by using the LUT that returns the roots of the polynomial expressed by the following Formula (22) with a value represented by the following Formula (21) as the key information.

$$y = \sqrt[3]{\beta} z \quad (19)$$

$$\sigma(x) = \left(\sqrt[3]{\beta} z\right)^3 + \frac{\gamma}{\beta}\left(\sqrt[3]{\beta} z\right) + \beta = \beta\left(z^3 + \frac{\gamma}{\sqrt[3]{\beta^5}} z + 1\right) \quad (20)$$

$$\frac{\gamma}{\sqrt[3]{\beta^5}} \quad (21)$$

$$z^3 + \frac{\gamma}{\sqrt[3]{\beta^5}} z + 1 \quad (22)$$

Moreover, by multiplying each of the obtained roots $z_1$, $z_2$, and $z_3$ by $\sqrt[3]{(\beta)}$, the roots $y_1$, $y_2$, and $y_3$ of transformed polynomial are obtained. Moreover, by adding $s_1$ to each of the obtained roots $y_1$, $y_2$, and $y_3$, the roots $x_1$, $x_2$, and $x_3$ of $\sigma(x)$ are obtained.

The root calculation circuit 100-2 is configured to execute the root calculation of the second-order and third-order error locator polynomials as described above. Details of the root calculation circuit 100-2 in FIG. 5 will be described. The root calculation circuit 100-2 includes the root calculation circuit 120-2 and arithmetic circuits 132 to 135. Since the configuration of the arithmetic circuits 132 to 135 is similar to that of the first embodiment (FIG. 2), the same reference numerals are given and description thereof is omitted.

The root calculation circuit 120-2 includes arithmetic circuits 121-2 to 123-2, an LUT 124-2, and arithmetic circuits 125-2 to 127-2. The arithmetic circuits 121-2 to 123-2, the LUT 124-2, and the arithmetic circuits 125-2 to 127-2 execute the following operations, respectively.

Arithmetic circuit 121-2 calculates $\beta$ to the power of $(-5/3)$.

Arithmetic circuit 122-2 calculates square of $\beta$.

Arithmetic circuit 123-2 multiplies $\beta$ to the power of $(-5/3)$ by $\gamma$, and outputs $\gamma/(\sqrt[3]{(\beta^5)})$ that is a multiplication result.

LUT 124-2 outputs roots $z_1$ and $z_2$ by using $\gamma/(\sqrt[3]{(\beta^5)})$ as key information.

Arithmetic circuit 125-2 multiplies the square of $\beta$ ($\beta^2$) and $\beta$ to the power of $(-5/3)$, and outputs $\beta^2/(\sqrt[3]{(\beta^5)}) = \sqrt[3]{(\beta)}$ that is a result of multiplication.

Arithmetic circuit 126-2 multiplies root $z_1$ and $\sqrt[3]{(\beta)}$, and outputs root $y_1$ that is a result of the multiplication.

Arithmetic circuit 127-2 multiplies root $z_2$ and $\sqrt[3]{(\beta)}$, and outputs root $y_2$ that is a result of the multiplication.

In the present embodiment, one arithmetic circuit 121-2 that calculates $(-5/3)$ power may be provided as a calculation circuit having a scale similar to that of the inverse element calculation circuit. Moreover, in the present embodiment, by using $\beta$ alone as variable transformation out of $\beta$ and $\gamma$, calculation to be necessary for $\gamma$ out of $\beta$ and $\gamma$ is only one multiplication by the arithmetic circuit 123-2. Therefore, the calculation of the roots of the error locator polynomial in the case of 2 or 3 can be implemented by a simpler configuration.

Note that the present embodiment can be applied to $GF(2^m)$ in which the existence of the cubic root is guaranteed (m is a value indivisible by 2), that is, applied to a case where m is indivisible by 2 (when m is an odd number).

Since the procedure the decoding processing of the second embodiment is similar to the flowchart of FIG. 4 illustrating the example of the first embodiment, the description thereof will be omitted.

As described above, according to the first and second embodiments, error correction (decoding) can be executed with a simpler configuration.

While certain embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a non-volatile memory configured to store data encoded with an error correction code for correcting an error of n bits or less, n being an integer of 3 or more; and
    a memory controller configured to
        read a received word from the non-volatile memory;
        calculate syndromes by using the received word;
        estimate the number of error bits by using the syndromes;
        perform processing when the number of error bits is estimated to be 2 or 3, the processing including
            executing variable transformation on a variable of an error locator polynomial corresponding to the number of error bits by using a calculated value being either a first value or a second value, the first value and the second value being calculated on the basis of the syndromes, and
            executing, by using the first value and the second value, calculation of roots of a transformed polynomial into which the error locator polynomial has been transformed according to the variable transformation;
        obtain roots of the error locator polynomial by executing a variable inverse transformation using the calculated value at roots of the transformed polynomial; and
        correct an error of error locations corresponding to roots of the error locator polynomial.

2. The memory system according to claim 1, wherein the memory controller is configured to, when the number of error bits is estimated to be 2 or 3,
    calculate key information by using the first value and the second value, and
    obtain the roots corresponding to the key information by using correspondence information in which possible values of the key information and the roots of the transformed polynomial are associated with each other.

3. The memory system according to claim 2, wherein the memory controller is configured to
    calculate three syndromes $s_1$, $s_3$, and $s_5$ respectively corresponding to the values obtained by substituting the first power, the third power, and the fifth power of $\alpha$ for a received word, where $\alpha$ is a primitive element of the Galois field, calculate $\beta=s_1^3+s_3$ as the first value,
calculate $\gamma=s_1^5+s_5$ as the second value,
set the second value being $\gamma$ as the calculated value, and, $$\frac{\beta}{\sqrt[5]{\gamma^3}} \quad (1)$$

$$x = y + s_1, \; y = \sqrt[5]{\gamma} \, z \quad (2)$$

$$z^3 + \left(1/\frac{\beta}{\sqrt[5]{\gamma^3}}\right)z + \frac{\beta}{\sqrt[5]{\gamma^3}} \quad (3)$$

let a value represented by Formula (1) be the key information, execute the variable transformation represented by Formula (2) and the calculation of the roots of the transformed polynomial represented by Formula (3).

4. The memory system according to claim 2, wherein the memory controller is configured to
calculate three syndromes $s_1$, $s_3$, and $s_5$ respectively corresponding to the values obtained by substituting the first power, the third power, and the fifth power of $\alpha$ for a received word, where $\alpha$ is being a primitive element of the Galois field,
calculate $\beta=s_1^3+s_3$ as the first value,
calculate $\gamma=s_1^5+s_5$ as the second value,
set the first value being $\beta$ as the calculated value, and, $$\frac{\gamma}{\sqrt[3]{\beta^5}} \quad (4)$$

$$x = y + s_1, \; y = \sqrt[3]{\beta} \, z \quad (5)$$

$$z^3 + \frac{\gamma}{\sqrt[3]{\beta^5}} z + 1 \quad (6)$$

let a value represented by Formula (4) be the key information, execute the variable transformation represented by Formula (5) and the calculation of the roots of the transformed polynomial represented by Formula (6).

5. The memory system according to claim 2, wherein the memory controller is configured to
calculate three syndromes $s_1$, $s_3$, and $s_5$ respectively corresponding to the values obtained by substituting the first power, the third power, and the fifth power of $\alpha$ for a received word, where $\alpha$ is a primitive element of the Galois field,
calculate $\beta=s_1^3+s_3$ as the first value,
calculate $\gamma=s_1^5+s_5$ as the second value,
set the second value being $\gamma$ as the calculated value, and, $$x = y + s_1 \quad (7)$$

$$y^3 + \beta \quad (8)$$

let the key information be $\beta$, execute the variable transformation represented by Formula (7) and the calculation of the roots of the transformed polynomial represented by Formula (8).

6. A memory controller connectable to a non-volatile memory, the non-volatile memory being capable of storing data encoded with an error correction code for correcting an error of n bits or less, n being an integer of 3 or more, the memory controller comprising:
a memory interface configured to read a received word from the non-volatile memory; and
a decoding circuit decoding the received word read by the memory interface, the decoding circuit being configured to
calculate syndromes by using the received word,
estimate the number of error bits by using the syndromes,
perform processing when the number of error bits is estimated to be 2 or 3, the processing including
executing variable transformation on a variable of an error locator polynomial corresponding to the number of error bits by using a calculated value being either a first value or a second value, the first value and the second value being calculated on the basis of the syndromes, and
executing, by using the first value and the second value, calculation of roots of a transformed polynomial into which the error locator polynomial has been transformed according to the variable transformation,
obtain roots of the error locator polynomial by executing a variable inverse transformation using the calculated roots of the transformed polynomial, and
correct an error of error locations corresponding to roots of the error locator polynomial.

7. The memory controller according to claim 6, wherein the decoding circuit is configured to, when the number of error bits is estimated to be 2 or 3,
calculate key information by using the first value and the second value, and
obtain the roots corresponding to the key information by using correspondence information in which possible values of the key information and the roots of the transformed polynomial are associated with each other.

8. The memory controller according to claim 7, wherein the decoding circuit is configured to
calculate three syndromes $s_1$, $s_3$, and $s_5$ respectively corresponding to the values obtained by substituting the first power, the third power, and the fifth power of $\alpha$ for a received word, where $\alpha$ is a primitive element of the Galois field,
calculate $\beta=s_1^3+s_3$ as the first value,
calculate $\gamma=s_1^5+s_5$ as the second value,
set the second value being $\gamma$ as the calculated value, and, $$\frac{\beta}{\sqrt[5]{\gamma^3}} \quad (1)$$

$$x = y + s_1, \; y = \sqrt[5]{\gamma} \, z \quad (2)$$

$$z^3 + \left(1/\frac{\beta}{\sqrt[5]{\gamma^3}}\right)z + \frac{\beta}{\sqrt[5]{\gamma^3}} \quad (3)$$

let a value represented by Formula (1) be the key information, execute the variable transformation represented by Formula (2) and the calculation of the roots of the transformed polynomial represented by Formula (3).

9. The memory controller according to claim 7, wherein the decoding circuit is configured to
calculate three syndromes $s_1$, $s_3$, and $s_5$ respectively corresponding to the values obtained by substituting the first power, the third power, and the fifth power of α for a received word, where α is a primitive element of the Galois field, calculate $\beta=s_1^3+s_3$ as the first value, calculate $\gamma=s_1^5+s_5$ as the second value, set the first value being β as the calculated value, and, $$\frac{\gamma}{\sqrt[3]{\beta^5}} \quad (4)$$

$$x = y + s_1, y = \sqrt[3]{\beta}z \quad (5)$$

$$z^3 + \frac{\gamma}{\sqrt[3]{\beta^5}}z + 1 \quad (6)$$

let a value represented by Formula (4) be the key information, execute the variable transformation represented by Formula (5) and the calculation of the roots of the transformed polynomial represented by Formula (6).

10. The memory controller according to claim 7, wherein the decoding circuit is configured to calculate three syndromes $s_1$, $s_3$, and $s_5$ respectively corresponding to the values obtained by substituting the first power, the third power, and the fifth power of α for a received word, where α is a primitive element of the Galois field, calculate $\beta=s_1^3+s_3$ as the first value, calculate $\gamma=s_1^5+s_5$ as the second value, set the second value being γ as the calculated value, and, $$x = y + s_1 \quad (7)$$

$$y^3 + \beta \quad (8)$$

let the key information be β, execute the variable transformation represented by Formula (7) and the calculation of the roots of the transformed polynomial represented by Formula (8).

11. A method of controlling a non-volatile memory, the method comprising:

storing, in the non-volatile memory, data encoded with an error correction code for correcting an error of n bits or less, n being an integer of 3 or more;

reading a received word from the non-volatile memory;

calculating syndromes by using the received word;

estimating the number of error bits by using the syndromes;

executing variable transformation on a variable of an error locator polynomial corresponding to the number of error bits by using a calculated value being either a first value or a second value, the number of error bits being estimated to be 2 or 3, the first value and the second value being calculated on the basis of the syndromes;

executing, by using the first value and the second value, calculation of roots of a transformed polynomial into which the error locator polynomial has been transformed according to the variable transformation;

obtaining roots of the error locator polynomial by executing a variable inverse transformation using the calculated roots of the transformed polynomial; and correcting an error of error locations corresponding to roots of the error locator polynomial.

12. The method according to claim 11, further comprising:

calculating key information by using the first value and the second value; and obtaining the roots corresponding to the key information by using correspondence information in which possible values of the key information and the roots of the transformed polynomial are associated with each other.

13. The method according to claim 12, further comprising:

calculating three syndromes $s_1$, $s_3$, and $s_5$ respectively corresponding to the values obtained by substituting the first power, the third power, and the fifth power of α for a received word, where α is a primitive element of the Galois field;

calculating $\beta=s_1^3+s_3$ as the first value;

calculating $\gamma=s_1^5+s_5$ as the second value;

setting the second value being γ as the calculated value; and, $$\frac{\beta}{\sqrt[5]{\gamma^3}} \quad (1)$$

$$x = y + s_1, y = \sqrt[5]{\gamma}z \quad (2)$$

$$z^3 + \left(1/\frac{\beta}{\sqrt[5]{\gamma^3}}\right)z + \frac{\beta}{\sqrt[5]{\gamma^3}} \quad (3)$$

let a value represented by Formula (1) be the key information, executing the variable transformation represented by Formula (2) and the calculation of the roots of the transformed polynomial represented by Formula (3).

14. The method according to claim 12, further comprising:

calculating three syndromes $s_1$, $s_3$, and $s_5$ respectively corresponding to the values obtained by substituting the first power, the third power, and the fifth power of α for a received word, where α is a primitive element of the Galois field;

calculating $\beta=s_1^3+s_3$ as the first value;

calculating $\gamma=s_1^5+s_5$ as the second value;

setting the first value being β as the calculated value; and, $$\frac{\gamma}{\sqrt[3]{\beta^5}} \quad (4)$$

$$x = y + s_1, y = \sqrt[3]{\beta}z \quad (5)$$

$$z^3 + \frac{\gamma}{\sqrt[3]{\beta^5}}z + 1 \quad (6)$$

let a value represented by Formula (4) be the key information, executing the variable transformation represented by Formula (5) and the calculation of the roots of the transformed polynomial represented by Formula (6).

15. The method according to claim 12, further comprising:

calculating three syndromes $s_1$, $s_3$, and $s_5$ respectively corresponding to the values obtained by substituting the first power, the third power, and the fifth power of α for a received word, where α is a primitive element of the Galois field;

calculating $\beta=s_1^3+s_3$ as the first value;
calculating $\gamma=s_1^5+s_5$ as the second value;
setting the second value being $\gamma$ as the calculated value; and, $$x = y + s_1 \qquad (7)$$

$$y^3 + \beta \qquad (8)$$

let the key information be $\beta$, executing the variable transformation represented by Formula (7) and the calculation of the roots of the transformed polynomial represented by Formula (8).

\* \* \* \* \*